United States Patent
Ganti et al.

(10) Patent No.: US 12,274,025 B2
(45) Date of Patent: Apr. 8, 2025

(54) METHOD FOR FABRICATING MEMS-BASED COOLING SYSTEMS

(71) Applicant: Frore Systems Inc., San Jose, CA (US)

(72) Inventors: Suryaprakash Ganti, Los Altos, CA (US); Brian James Gally, Los Gatos, CA (US); Ming Tung, Fremont, CA (US); Seshagiri Rao Madhavapeddy, La Jolla, CA (US); Vikram Mukundan, San Ramon, CA (US); Ananth Saran Yalamarthy, Stanford, CA (US); Leonard Eugene Fennell, San Jose, CA (US)

(73) Assignee: Frore Systems Inc., San Jose, CA (US)

( * ) Notice: Subject to any disclaimer, the term of this patent is extended or adjusted under 35 U.S.C. 154(b) by 360 days.

(21) Appl. No.: 17/468,151

(22) Filed: Sep. 7, 2021

(65) Prior Publication Data
US 2022/0087064 A1    Mar. 17, 2022

Related U.S. Application Data

(60) Provisional application No. 63/079,460, filed on Sep. 16, 2020.

(51) Int. Cl.
B23P 15/26 (2006.01)
H05K 7/20 (2006.01)
F04B 43/04 (2006.01)
H01L 23/473 (2006.01)

(52) U.S. Cl.
CPC ......... *H05K 7/20272* (2013.01); *B23P 15/26* (2013.01); *F04B 43/046* (2013.01); *H01L 23/473* (2013.01)

(58) Field of Classification Search
CPC .............................. B23P 15/26; H01L 23/473
See application file for complete search history.

(56) References Cited

U.S. PATENT DOCUMENTS

| | | | |
|---|---|---|---|
| 7,475,970 B2 * | 1/2009 | Sugahara | B41J 2/1623 347/68 |
| 7,797,808 B2 * | 9/2010 | Zhang | B32B 27/08 29/458 |
| 10,800,653 B2 * | 10/2020 | Mou | B81C 1/00166 |
| 2002/0175596 A1 | 11/2002 | Garimella | |
| 2005/0225213 A1 * | 10/2005 | Richards | H10N 30/306 310/339 |

(Continued)

FOREIGN PATENT DOCUMENTS

| | | | |
|---|---|---|---|
| EP | 3327295 A1 * | 5/2018 | ............ F04B 45/047 |
| KR | 20170090999 | 8/2017 | |
| TW | 201038894 | 11/2010 | |

*Primary Examiner* — Sarang Afzali
(74) *Attorney, Agent, or Firm* — Van Pelt, Yi & James LLP

(57) ABSTRACT

A method for providing a cooling system is described. The method includes providing a plurality of sheets. Each sheet includes at least one structure for a level in each cooling cell of a plurality of cooling cells. A particular level of each cooling cell includes a cooling element having a first side and a second side. The cooling element is configured to undergo vibrational motion to drive fluid from the first side to the second side. The method also includes aligning the sheets, attaching the sheets to form a laminate that includes the cooling cells, and separating the laminate into sections. Each section includes at least one cooling cell.

5 Claims, 12 Drawing Sheets

(56) References Cited

U.S. PATENT DOCUMENTS

| | | |
|---|---|---|
| 2014/0169996 A1 | 6/2014 | Tanaka |
| 2014/0248170 A1 | 9/2014 | Kabasawa |
| 2017/0058882 A1 | 3/2017 | Hirata |
| 2017/0276149 A1 | 9/2017 | Dusseau |
| 2020/0051895 A1 | 2/2020 | Ganti |
| 2020/0088185 A1 | 3/2020 | Mou |

* cited by examiner

METHOD FOR FABRICATING MEMS-BASED COOLING SYSTEMS

CROSS REFERENCE TO OTHER APPLICATIONS

This application claims priority to U.S. Provisional Patent Application No. 63/079,460 entitled METHOD AND SYSTEM FOR FABRICATING MEMS-BASED COOLING SYSTEMS filed Sep. 16, 2020 which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
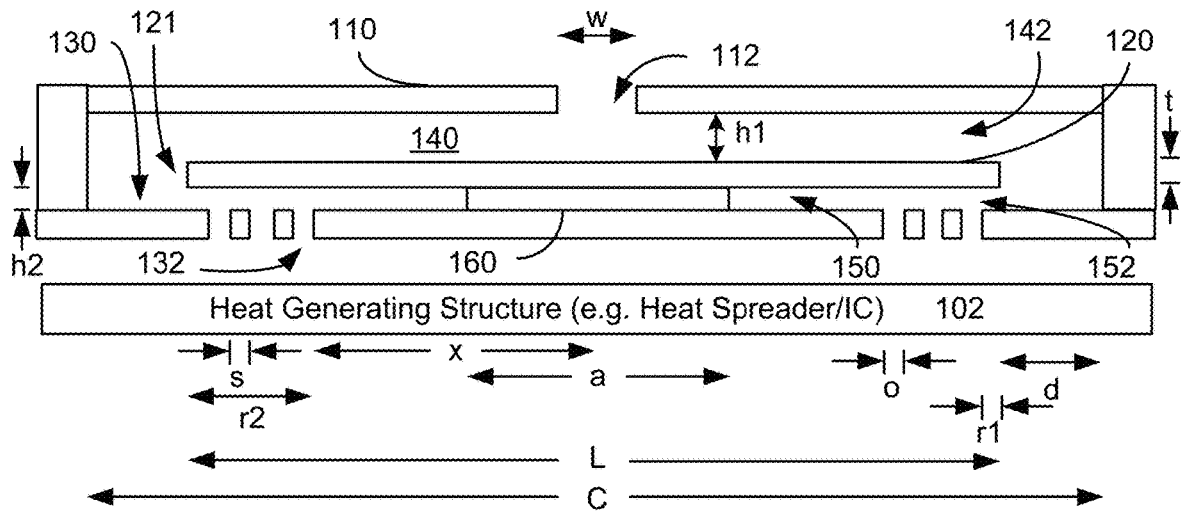
FIGS. 1A-1F depict an embodiment of an active cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated.

Varying configurations of computing devices further complicate heat management. For example, computing devices such as laptops are frequently open to the external environment while other computing devices, such as smartphones, are generally closed to the external environment. Thus, active heat management solutions for open devices, such as fans, may be inappropriate for closed devices. A fan driving heated fluid from the inside of the computing device to the outside environment may be too large for closed computing devices such as smartphones and may provide limited fluid flow. In addition, the closed computing device has no outlet for the heated fluid even if the fan can be incorporated into the closed computing device. Thus, the thermal management provided by such an open-device mechanism may have limited efficacy. Even for open computing devices, the location of the inlet and/or outlet may be configured differently for different devices. For example, an outlet for fan-driven fluid flow in a laptop may be desired to be located away from the user's hands or other structures that may lie within the outflow of heated fluid. Such a configuration not only prevents the user's discomfort but also allows the fan to provide the desired cooling. Another mobile device having a different configuration may require the inlets and/or outlets to be configured differently, may reduce the efficacy of such heat management systems and may prevent the use of such heat management systems. Thus, mechanisms for improving cooling in computing devices are desired.

A method for providing a cooling system is described. The method includes providing a plurality of sheets. Each sheet includes at least one structure for a level in each cooling cell of a plurality of cooling cells. A particular level of each cooling cell includes a cooling element having a first side and a second side. The cooling element is configured to undergo vibrational motion to drive fluid from the first side to the second side. The method also includes aligning the sheets, attaching the sheets to form a laminate that includes the cooling cells, and separating the laminate into sections. Each section includes at least one cooling cell.

Providing the sheets may include providing an orifice plate sheet, providing an active element sheet, and providing a top plate sheet. The orifice plate sheet includes orifices therein. The active element sheet includes the cooling element for each cooling cell. The cooling element has a central region and a perimeter. The top plate sheet includes at least one vent therein for each of the cooling cells. In some such embodiments, aligning includes locating the active element sheet between the top plate sheet and the orifice plate sheet. Attaching the sheets may include affixing the sheets such that the active element sheet is affixed to the orifice plate sheet, the frame sheet is affixed to the active element sheet, and the top plate sheet is affixed to the frame sheet. A frame sheet may also be provided. A portion of the frame sheet forms cell walls for each cooling cell.

In some embodiments, providing the active element sheet further includes selectively etching a substrate to provide a plurality of regions having a plurality of heights. In addition piezoelectric layer is provided on a portion of the substrate. In some such embodiments, providing the active element sheet further includes providing an insulating barrier on the steel substrate and providing a bottom electrode on the insulating barrier. The piezoelectric layer is on the bottom electrode. The method may also include connecting the bottom electrode to the substrate. Connecting the bottom electrode may include providing a jumper between the bottom electrode and the substrate or providing via(s) in the insulating barrier prior to the providing the bottom electrode and providing conductor(s) (e.g. metals) in the via(s). The substrate may include or consist of one or more of steel (e.g. stainless steel), Al (e.g. an Al alloy), and/or a Ti (e.g. a Ti alloy such as Ti6Al-4V). A support structure for the cooling element may also be defined from a portion of the active element sheet as part of providing the active element sheet.

A cooling system is also described. The cooling system includes a laminated cooling cell including a plurality of sheets. Each sheets including at least one structure for a level in the laminated cooling cell. An active element sheet includes a cooling element having a first side and a second side. The cooling element is configured to undergo vibrational motion to drive fluid from the first side to the second side. The sheets may further include an orifice plate sheet and a top plate sheet. The orifice plate sheet includes orifices therein. The top plate sheet has at least one vent therein. The active element sheet is between the orifice plate sheet and the top plate sheet. The cooling element has a central region and a perimeter configured to undergo the vibrational motion. In some embodiments, the active element sheet further includes a support structure at the central region of the cooling element. The active element sheet is coupled to the orifice plate sheet by the support structure. In some embodiments, the active element sheet includes piezoelectric layer. In such embodiments, the cooling element includes a substrate, an insulating barrier on the substrate, a bottom electrode on the insulating barrier, and an electrical connector between the bottom electrode and the stainless substrate. The piezoelectric layer is on the bottom electrode. The sheets may further include a frame sheet. A portion of the frame sheet forms cell walls for the laminated cooling cell. The frame sheet may be between the active element sheet and the top plate sheet.

A cooling system including a plurality of laminated cooling cells is described. The laminated cooling cells include a plurality of sheets. Each of the sheets includes at least one structure for a level in a laminated cooling cell. The sheets further include an orifice plate sheet, an active element sheet, and a top plate sheet. The orifice plate sheet has a plurality of orifices for each cooling cell therein. The active element sheet includes a cooling element for each laminated cooling cell. The cooling element has a first side and a second side. The cooling element is configured to undergo vibrational motion to drive fluid from the first side to the second side. In some embodiments, the cooling element has a central region and at least one cantilevered arm. The cantilevered arm(s) undergo the vibrational motion. The active element sheet may also include a support structure for the cooling element. The support structure is at the central portion of the cooling element and is coupled to the orifice plate. The top plate sheet has at least one vent therein for each of the laminated cooling cells. The active element sheet is between the orifice plate sheet and the top plate sheet. The sheets may further include a frame sheet. A portion of the frame sheet forms cell walls for each of the laminated cooling cell. In some embodiments, the frame sheet is between the active element sheet and the top plate sheet.

Figure 1B:
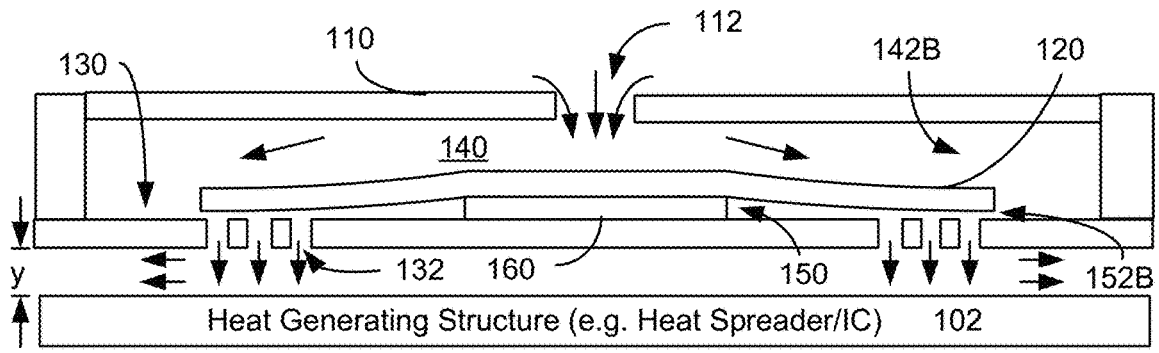
Figure 1C:
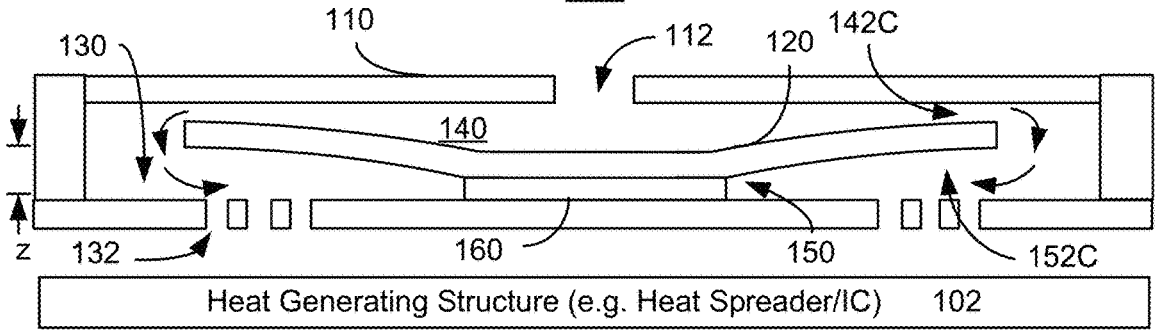
Figure 1D:
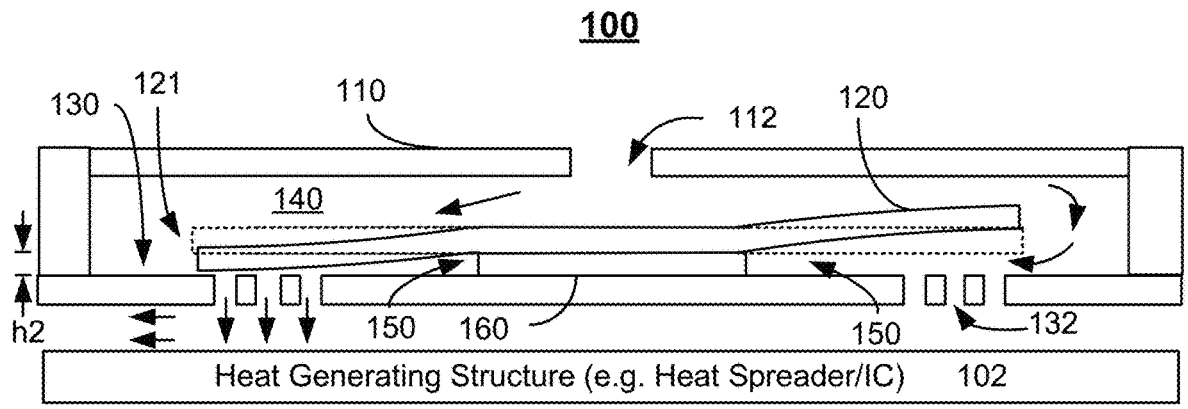
Figure 1E:
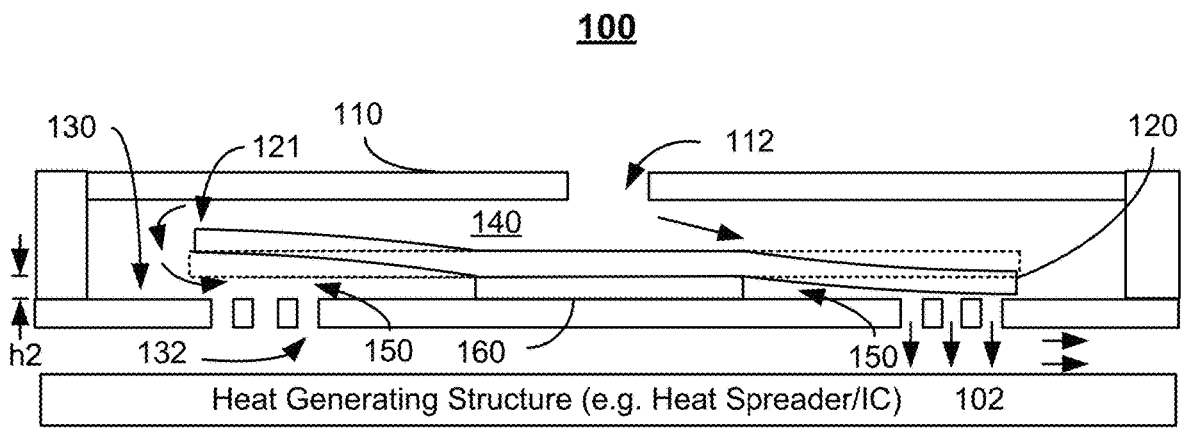
Figure 1F:
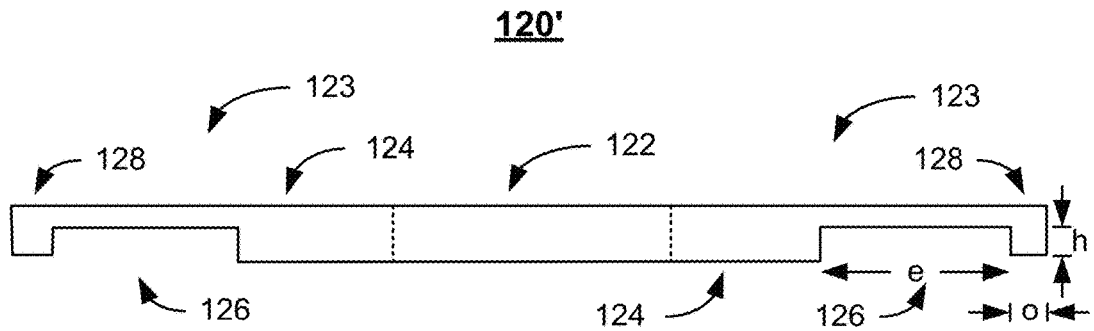

FIGS. 1A-1F are diagrams depicting an exemplary embodiment of active cooling system 100 usable with heat-generating structure 102 and including a centrally anchored cooling element 120 or 120'. Cooling element 120 is shown in FIGS. 1A-1E and cooling element 120' is shown in FIG. 1F. For clarity, only certain components are shown. FIGS. 1A-1F are not to scale. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A.

FIG. 1A depicts cooling system 100 in a neutral position. Thus, cooling element 120 is shown as substantially flat. For in-phase operation, cooling element 120 is driven to vibrate between positions shown in FIGS. 1B and 1C. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1E). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1E, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1E. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1E) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/50 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2 = n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that $L/2 = n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may be a stainless steel, Ni alloy and/or Hastelloy substrate. In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1E. Although described in the context of particular pressures, gap sizes, and timing of flow, operation of cooling system 100 is not dependent upon the explanation herein. FIGS. 1B-1C depict in-phase operation of cooling system 100. Referring to FIG. 1B, cooling element 120 has been actuated so that its tip 121 moves away from top plate 110. FIG. 1B can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1B. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1B.

Cooling element 120 is also actuated so that tip 121 moves away from heat-generating structure 102 and toward top plate 110. FIG. 1C can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1C. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1C. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 140. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1B and 1C is repeated. Thus, cooling element 120 undergoes vibrational motion indicated in FIGS. 1A-1C, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

FIGS. 1D-1E depict an embodiment of active cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. The movement of fluid is shown by unlabeled arrows in FIGS. 1D and 1E.

The motion between the positions shown in FIGS. 1D and 1E is repeated. Thus, cooling element 120 undergoes vibrational motion indicated in FIGS. 1A, 1D, and 1E, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1E, cooling system 100 may utilize cooling elements having different shapes. FIG. 1F depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1F, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 100 to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
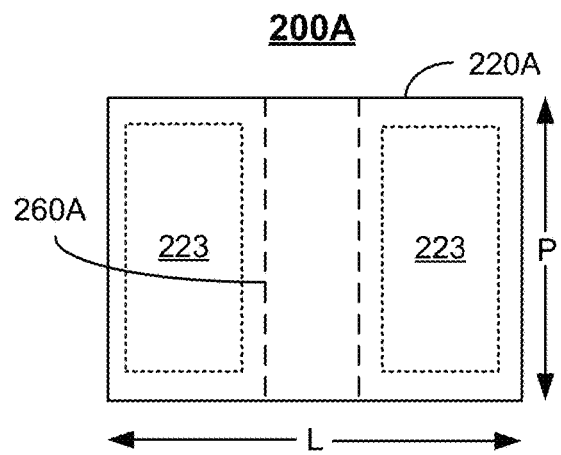
FIGS. 2A-2B depict embodiments of cooling elements usable in active cooling systems including centrally anchored cooling elements.
Figure 2B:
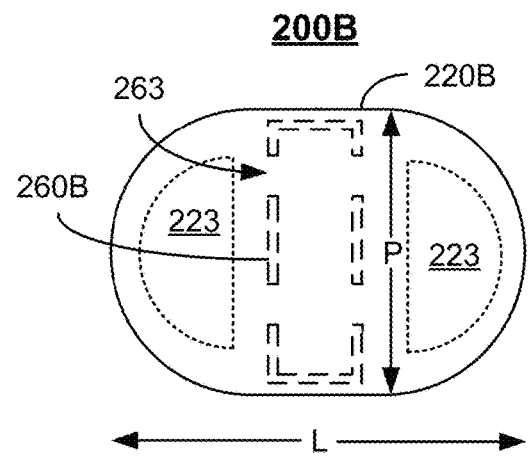

FIGS. 2A-2B depict plan views of embodiments of cooling systems 200A and 200B analogous to active cooling systems such as cooling system 100. FIGS. 2A and 2B are not to scale. For simplicity, only portions of cooling elements 220A and 220B and anchors 260A and 260B, respectively, are shown. Cooling elements 220A and 220B are analogous to cooling element 120/120'. Thus, the sizes and/or materials used for cooling elements 220A and/or 220B may be analogous to those for cooling element 120/120'. Anchors (support structures) 260A and 260B are analogous to anchor 160 and are indicated by dashed lines.

For cooling elements 220A and 220B, anchors 260A and 260B are centrally located and extend along a central axis of cooling elements 220A and 220B, respectively. Thus, the cantilevered portions that are actuated to vibrate are to the right and left of anchors 260A and 260B. In some embodiments, cooling element(s) 220A and/or 220B are continuous structures, two portions of which are actuated (e.g. the cantilevered portions outside of anchors 260A and 260B). In some embodiments, cooling element(s) 220A and/or 220B include separate cantilevered portions each of which is attached to the anchors 260A and 260B, respectively, and actuated. Cantilevered portions of cooling elements 220A and 220B may thus be configured to vibrate in a manner analogous to the wings of a butterfly (in-phase) or to a seesaw (out-of-phase). In FIGS. 2A and 2B, L is the length of the cooling element, analogous to that depicted in FIGS. 1A-1E. Also in FIGS. 2A and 2B, the depth, P, of cooling elements 220A and 220B is indicated.

Also shown by dotted lines in FIGS. 2A-2B are piezoelectric 223. Piezoelectric 223 is used to actuate cooling elements 220A and 220B. In some embodiments, piezoelectric 223 may be located in another region and/or have a different configuration. Although described in the context of a piezoelectric, another mechanism for actuating cooling elements 220A and 220B can be utilized. Such other mechanisms may be at the locations of piezoelectric 223 or may be located elsewhere. In cooling element 220A, piezoelectric 223 may be affixed to cantilevered portions or may be integrated into cooling element 220A. Further, although piezoelectric 223 is shown as having particular shapes and sizes in FIGS. 2A and 2B, other configurations may be used.

In the embodiment shown in FIG. 2A, anchor 260A extends the entire depth of cooling element 220A. Thus, a portion of the perimeter of cooling element 220A is pinned. The unpinned portions of the perimeter of cooling element 220A are part of the cantilevered sections that undergo vibrational motion. In other embodiments, anchor need not extend the entire length of the central axis. In such embodiments, the entire perimeter of the cooling element is unpinned. However, such a cooling element still has cantilevered sections configured to vibrate in a manner described herein. For example, in FIG. 2B, anchor 260B does not extend to the perimeter of cooling element 220B. Thus, the perimeter of cooling element 220B is unpinned. However, anchor 260B still extends along the central axis of cooling element 220B. Cooling element 220B is still actuated such that cantilevered portions vibrate (e.g. analogous to the wings of a butterfly).

Although cooling element 220 A is depicted as rectangular, cooling elements may have another shape. In some embodiments, corners of cooling element 220A may be rounded. Cooling element 220B of FIG. 2B has rounded cantilevered sections. Other shapes are possible. In the embodiment shown in FIG. 2B, anchor 260B is hollow and includes apertures 263. In some embodiments, cooling element 220B has aperture(s) in the region of anchor 260B. In some embodiments, cooling element 220B includes multiple portions such that aperture(s) exist in the region of anchor 260B. As a result, fluid may be drawn through cooling element 220B and through anchor 260B. Thus, cooling element 220B may be used in place of a top plate, such as top plate 110. In such embodiments, apertures in cooling element 220B and apertures 263 may function in an analogous manner to vent 112. Further, although cooling elements 200A and 200B are depicted as being supported in a central region, in some embodiments, one cantilevered section of the cooling element 220A and/or 220B might be omitted. In such embodiments, cooling element 220A and/or 220B may be considered to be supported, or anchored, at or near one edge, while at least part of at least the opposing edge is free to undergo vibrational motion. In some such embodiments, the cooling element 220A and/or 220B may include a single cantilevered section that undergoes vibrational motion.

Figure 3A:
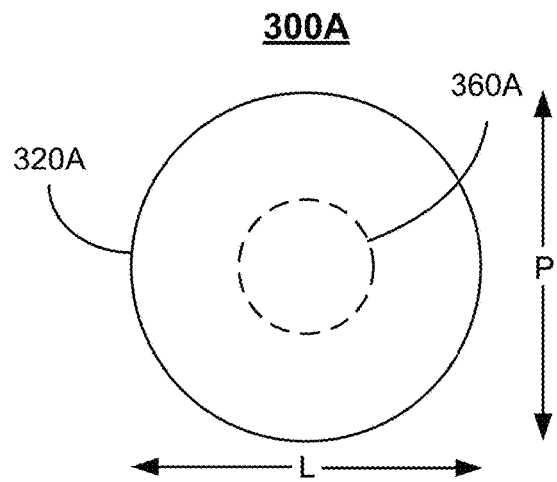
FIGS. 3A-3B depict embodiments of cooling elements usable in active cooling systems including centrally anchored cooling elements.
Figure 3B:
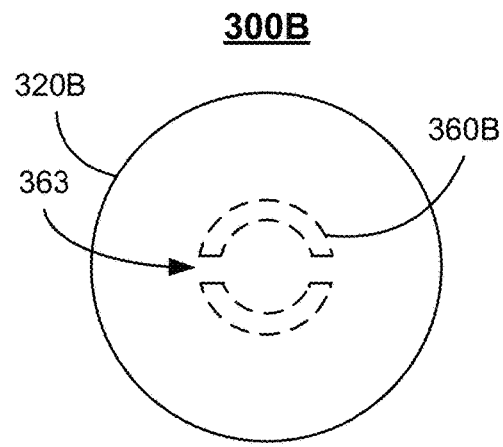

FIGS. 3A-3B depict plan views of embodiments of cooling systems 300A and 300B analogous to active cooling systems such as cooling system 100. FIGS. 3A and 3B are not to scale. For simplicity, only cooling elements 320A and 320B and anchors 360A and 360B, respectively, are shown. Cooling elements 320A and 320B are analogous to cooling element 120/120'. Thus, the sizes and/or materials used for cooling elements 320A and/or 320B may be analogous to those for cooling element 120/120'. Anchors 360A and 360B are analogous to anchor 160 and are indicated by dashed lines.

For cooling elements 320A and 320B, anchors 360A and 360B, respectively, are limited to a central region of cooling elements 320A and 320B, respectively. Thus, the regions surrounding anchors 360A and 360B undergo vibrational motion. Cooling elements 320A and 320B may thus be configured to vibrate in a manner analogous to a jellyfish or similar to the opening/closing of an umbrella. In some embodiments, the entire perimeter of cooling elements 320A and 320B vibrate in phase (e.g. all move up or down together). In other embodiments, portions of the perimeter of cooling elements 320A and 320B vibrate out of phase. In FIGS. 3A and 3B, L is the length (e.g. diameter) of the cooling element, analogous to that depicted in FIGS. 1A-1E. Although cooling elements 320A and 320B are depicted as circular, cooling elements may have another shape. Further, a piezoelectric (not shown in FIGS. 3A-3B) and/or other mechanism may be used to drive the vibrational motion of cooling elements 320A and 320B.

In the embodiment shown in FIG. 3B, the anchor 360B is hollow and has apertures 363. In some embodiments, cooling element 320B has aperture(s) in the region of anchor 360B. In some embodiments, cooling element 320B includes multiple portions such that aperture(s) exist in the region of anchor 360B. As a result, fluid may be drawn through cooling element 320B and through anchor 360B. The fluid may exit through apertures 363. Thus, cooling element 320B may be used in place of a top plate, such as top plate 110. In such embodiments, apertures in cooling element 320B and apertures 363 may function in an analogous manner to vent 112.

Cooling systems such as cooling system 100 can utilize cooling element(s) 220A, 220B, 320A, 320B and/or analogous cooling elements. Such cooling systems may also share the benefits of cooling system 100. Cooling systems using cooling element(s) 220A, 220B, 320A, 320B and/or analogous cooling elements may more efficiently drive fluid toward heat-generating structures at high speeds. Consequently, heat transfer between the heat-generating structure and the moving fluid is improved. Because the heat-generating structure is more efficiently cooled, the corresponding device may exhibit improved operation, such as running at higher speed and/or power for longer times. Cooling systems employing cooling element(s) 220A, 220B, 320A, 320B and/or analogous cooling elements may be suitable for use in smaller and/or mobile devices in which limited space is available. Performance of such devices may thus be improved. Because cooling element(s) 220A, 220B, 320A, 320B and/or analogous cooling elements may be vibrated at frequencies of 15 kHz or more, users may not hear any noise associated with actuation of cooling elements. If driven at or near the acoustic and/or structural resonance frequencies for the cooling element(s) 220A, 220B, 320A, 320B and/or analogous cooling elements, the power used in operating cooling systems may be significantly reduced. Cooling element(s) 220A, 220B, 320A, 320B and/or analogous cooling elements may not physically contact the plates during use, allowing resonance to be more readily maintained. The benefits of improved, quiet cooling may be achieved with limited additional power. Consequently, performance of devices incorporating the cooling element(s) 220A, 220B, 320A, 320B and/or analogous cooling elements may be improved.

Figure 4A:
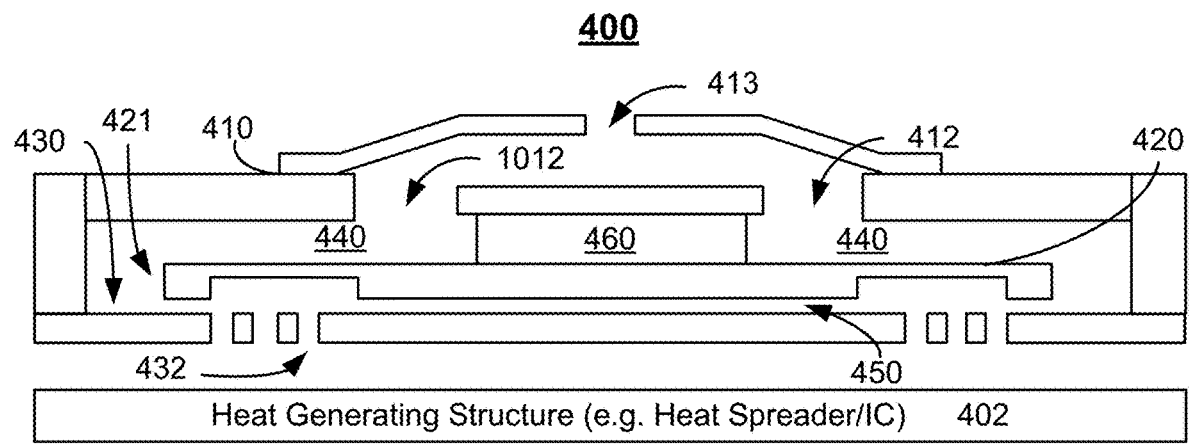
FIGS. 4A-4B depict an embodiment of an active cooling system including a centrally anchored cooling element.
Figure 4B:
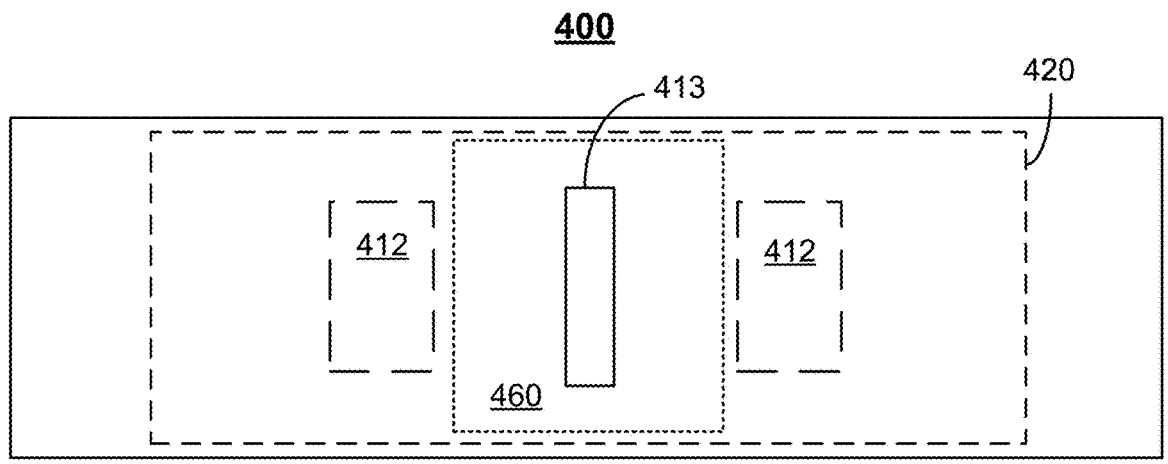

FIGS. 4A-4B depict an embodiment of active cooling system 400 including a top centrally anchored cooling element. FIG. 4A depicts a side view of cooling system 400 in a neutral position. FIG. 4B depicts a top view of cooling system 400. FIGS. 4A-4B are not to scale. For simplicity, only portions of cooling system 400 are shown. Referring to FIGS. 4A-4B, cooling system 400 is analogous to cooling system 100. Consequently, analogous components have similar labels. For example, cooling system 400 is used in conjunction with heat-generating structure 402, which is analogous to heat-generating structure 102.

Cooling system 400 includes top plate 410 having vents 412, cooling element 420, orifice plate 430 including orifices 432, top chamber 440 having a gap, bottom chamber 450 having a gap, flow chamber 440/450, and anchor (i.e. support structure) 460 that are analogous to top plate 110 having vent 112, cooling element 220, orifice plate 130 including orifices 132, top chamber 140 having gap 142, bottom chamber 150 having gap 152, flow chamber 140/150, and anchor (i.e. support structure) 160, respectively. Thus, cooling element 420 is centrally supported by anchor 460 such that at least a portion of the perimeter of cooling element 420 is free to vibrate. In some embodiments, anchor 460 extends along the axis of cooling element 420 (e.g. in a manner analogous to anchor 260A and/or 260B). In other embodiments, anchor 460 is only near the center portion of cooling element 420 (e.g. analogous to anchor 460C and/or 460D). Although not explicitly labeled in FIGS. 4A and 4B, cooling element 420 includes an anchored region and cantilevered arms including step region, extension region and outer regions analogous to anchored region 122, cantilevered arms 123, step region 124, extension region 126 and outer region 128 of cooling element 120'. In some embodiments, cantilevered arms of cooling element 420 are driven in-phase. In some embodiments, cantilevered arms of cooling element 420 are driven out-of-phase. In some embodiments, a simple cooling element, such as cooling element 120, may be used.

Anchor 460 supports cooling element 420 from above. Thus, cooling element 420 is suspended from anchor 460. Anchor 460 is suspended from top plate 410. Top plate 410 includes vent 413. Vents 412 on the sides of anchor 460 provide a path for fluid to flow into sides of chamber 440.

As discussed above with respect to cooling system 100, cooling element 420 may be driven to vibrate at or near the structural resonant frequency of cooling element 420. Further, the structural resonant frequency of cooling element 420 may be configured to align with the acoustic resonance of the chamber 440/1050. The structural and acoustic resonant frequencies are generally chosen to be in the ultrasonic range. For example, the vibrational motion of cooling element 420 may be at the frequencies described with respect to cooling system 100. Consequently, efficiency and flow rate may be enhanced. However, other frequencies may be used.

Cooling system 400 operates in an analogous manner to cooling system 100. Cooling system 400 thus shares the benefits of cooling system 100. Thus, performance of a device employing cooling system 400 may be improved. In addition, suspending cooling element 420 from anchor 460 may further enhance performance. In particular, vibrations in cooling system 400 that may affect other cooling cells (not shown), may be reduced. For example, less vibration may be induced in top plate 410 due to the motion of cooling element 420. Consequently, cross talk between cooling system 400 and other cooling systems (e.g. other cells) or other portions of the device incorporating cooling system 400 may be reduced. Thus, performance may be further enhanced.

Figure 5A:
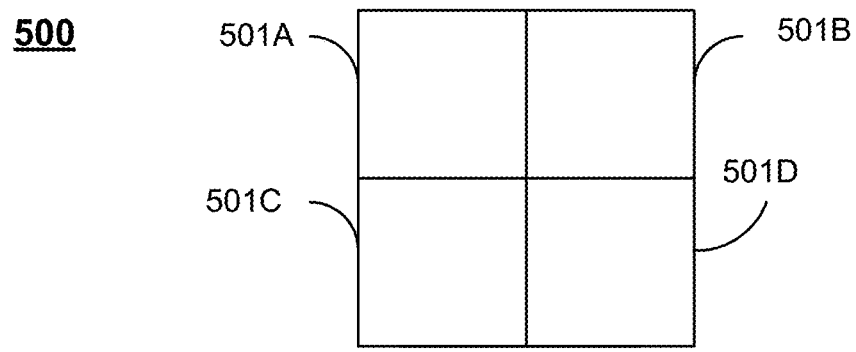
FIGS. 5A-5E depict an embodiment of an active cooling system formed in a tile.
Figure 5B:
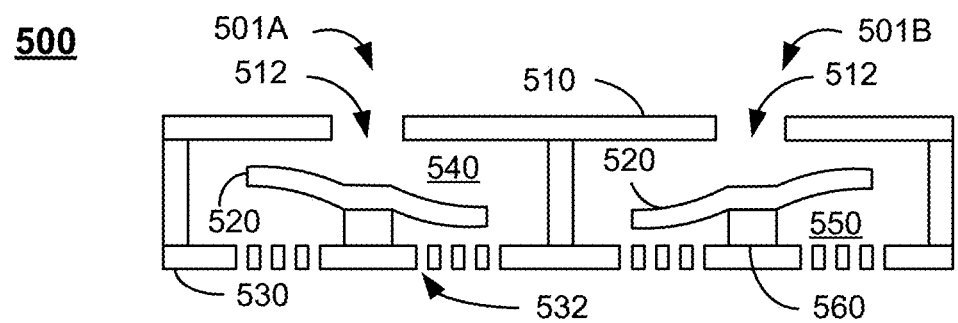
Figure 5C:
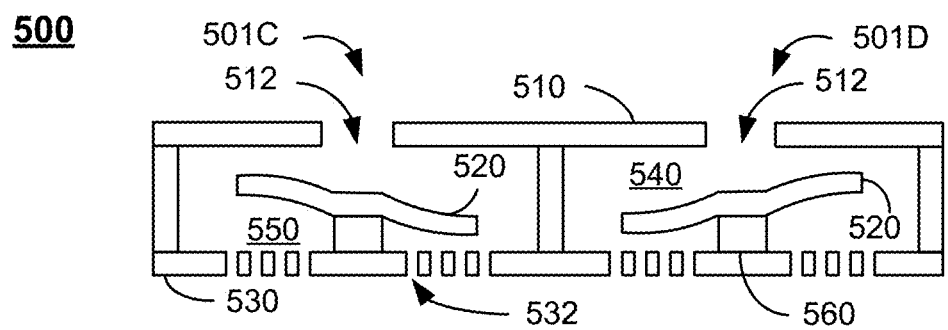
Figure 5D:
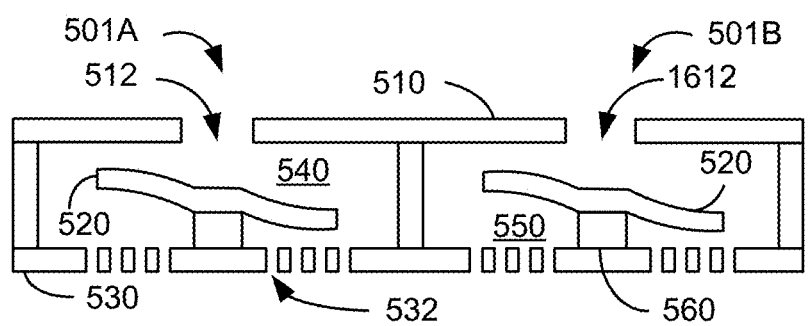
Figure 5E:
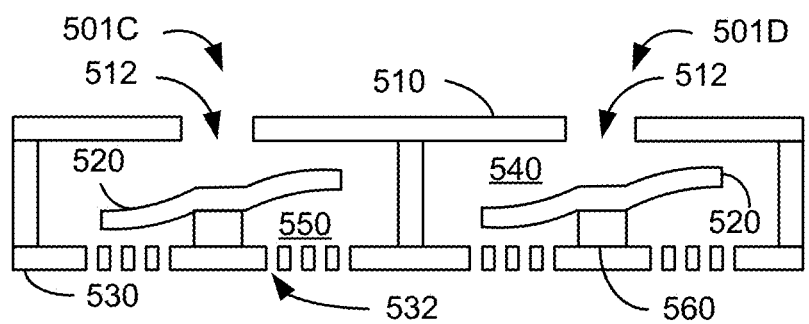

FIGS. 5A-5E depict an embodiment of active cooling system 500 including multiple cooling cells configured as a tile, or array. FIG. 5A depicts a top view, while FIGS. 5B-5E depict side views. FIGS. 5A-5E are not to scale. Cooling system 500 includes four cooling cells 501A, 501B, 501C and 501D (collectively or generically 501), which are analogous to one or more of cooling systems described herein. More specifically, cooling cells 501 are analogous to cooling system 100 and/or 400. Although four cooling cells 501 in a 2×2 configuration are shown, in some embodiments another number and/or another configuration of cooling cells 501 might be employed. In the embodiment shown, cooling cells 501 include shared top plate 510 having apertures 512, cooling elements 520, shared orifice plate 530 including orifices 532, top chambers 540, bottom chambers 550 and anchors (support structures) 560 that are analogous to top plate 110 having apertures 112, cooling element 120, orifice plate 130 having orifices 132, top chamber 140, bottom chamber 150 and anchor 160. In some embodiments, cooling cells 501 may be fabricated together and separated, for example by cutting through top plate 510, side walls between cooling cells 501, and orifice plate 530. Thus, although described in the context of a shared top plate 510 and shared orifice plate 530, after fabrication cooling cells 501 may be separated. In some embodiments, tabs (not shown) and/or other structures such as anchors 560, may connect cooling cells 501. Further, tile 500 may be affixed to a heat-generating structure (e.g. a heat sink, integrated circuit, or other structure) that may be part of an integrated system including tile 500 or may be separate from tile 500. In addition, a hood or other mechanism for directing fluid flow outside of cooling cells 501, mechanical stability, or protection may also be included. Electrical connection to cooling cells 501 is also not shown in FIGS. 5A-5E. Cooling elements 520 are driven out-of-phase (i.e. in a manner analogous to a seesaw). Further, as can be seen in FIGS. 5B-5C and FIGS. 5D-5E cooling element 520 in one cell is driven out-of-phase with cooling element(s) 520 in adjacent cell(s). In FIGS. 5B-5C, cooling elements 520 in a row are driven out-of-phase. Thus, cooling element 520 in cell 501A is out-of-phase with cooling element 520 in cell 501B. Similarly, cooling element 520 in cell 501C is out-of-phase with cooling element 520 in cell 501D. In FIGS. 5D-5E, cooling elements 520 in a column are driven out-of-phase. Thus, cooling element 520 in cell 501A is out-of-phase with cooling element 520 in cell 501C. Similarly, cooling element 520 in cell 501B is out-of-phase with cooling element 520 in cell 501D. By driving cooling elements 520 out-of-phase, vibrations in cooling system 500 may be reduced.

Cooling cells 501 of cooling system 500 functions in an analogous manner to cooling system(s) 100, 400, and/or an analogous cooling system. Consequently, the benefits described herein may be shared by cooling system 500. Because cooling elements in nearby cells are driven out-of-phase, vibrations in cooling system 500 may be reduced. Because multiple cooling cells 501 are used, cooling system 500 may enjoy enhanced cooling capabilities. Further, multiples of individual cooling cells 501 and/or cooling system 500 may be combined in various fashions to obtain the desired footprint of cooling cells.

Figure 6:
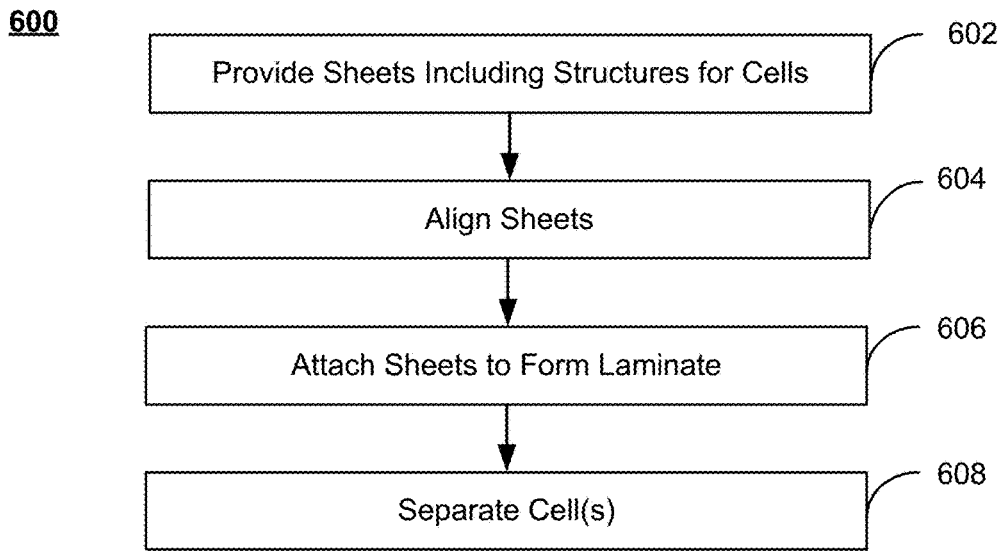
FIG. 6 is a flow chart depicting an embodiment of a method for providing cooling system(s) using sheet level fabrication.

FIG. 6 is a flow chart depicting an embodiment of method 600 for forming cooling system(s) using sheet level fabrication. For simplicity, not all steps are shown. Further, the steps may be performed in another order, include substeps and/or be combined. Method 600 is primarily described in the context of fabricating multiple cooling systems. However, a single cooling system may be formed.

The sheet(s) for various structures in the cooling system are provided, at 602. Each sheet includes at least one structure for a level in each cooling cell. Each sheet generally also includes structure(s) for multiple cooling cells. A particular level of the cooling cell includes a cooling element having a first side and a second side. Once the cooling cell(s) are fabricated, the cooling element is configured to undergo vibrational motion to drive fluid from the first side to the second side. For example, an active element sheet may be formed as part of 602. The active element sheet includes the cooling elements and resides at the particular level of the cooling cell. Thus, the substrate and piezoelectric layer(s) for a cooling element, such as cooling elements 120, 420, and/or 520 may be provided for each cell as part of forming the active element sheet at 602. Similarly, an orifice plate sheet including the orifice plate for each cell and/or a top plate sheet including the top plate for each cell may be provided as part of 602. Thus, the orifice plate 130, 430, and/or 530 as well as the top plate 110, 410, and/or 510 may be formed. Structures are also provided in and/or on the sheets, at 602. Thus, cavities, trenches, through holes, tapers and other features may be etched into various sheets. For example, the orifices may be formed for each orifice plate in the orifice plate sheet. The vent may be formed in each top plate of the top plate sheet. A simple cooling element and/or the step region, extended region, and outer region of an engineered cooling element may be formed for each cooling element in the active element sheet. In some embodiments, the anchor is formed from the active element sheet as part of 602. For example, the substrate for the sheet may be etched to form the anchor as well as the cooling element. Alternatively, the anchor may be formed separately from a different sheet. Piezoelectric layers, insulating layers, conductive layers and/or other components may also be fabricated on the sheets as part of 602. In some embodiments, some or all of such structures may be provided on the corresponding sheets after the sheet has been affixed to one or more other sheets. Thus, the cooling element, anchor, orifice plate, top plate, orifices, vent, chamber walls and/or other features of the structures may be formed at 602. In some embodiments, the structures for individual cells are separately formed at 602. In some embodiments, structures for multiple cells are formed at 602. For example, a single large orifice plate including multiple sets of orifices for multiple cells may be provided at 602. The sheets fabricated at 602 are independent and, in some embodiments, physically separate. Thus, each sheet fabricated at 602 may be separable from other sheets.

The sheets are aligned, at 604. The sheets are attached to form cooling cells, at 606. In some embodiments, 606 laminates the layers to form a large sheet including multiple cooling cells. Processes 604 and 606 may be alternately performed. For example, the active element sheet may be aligned with the orifice plate sheet at 604 and the two sheets attached, at 606. In some embodiments, portions of the chamber walls of individual cells are fabricated on the orifice plate sheet and/or top plate sheet. In some embodiments, a frame and/or additional members forming the chamber walls are aligned at 604 and mounted on the orifice plate sheet and/or active element sheet at 606. The top plate sheet is aligned and mounted to the cooling element or frame sheet at 604 and 606. Thus, layers for the cooling cells are aligned and assembled. Other configurations and orders of sheets are possible.

In some embodiments, the layers are affixed at 606 using epoxy, welding and/or another type adhesive and/or process. In some embodiments, liquid epoxy may be dispensed and cured. In some embodiments, dies are used to align and attach layers of the cooling system. In some embodiments, various adhesive are utilized at 606 to affix components of the cooling cells. The adhesives may include fillers to provide the desired properties. For example, the adhesive may include electrically conductive fillers, fillers that increase the Young's modulus, fillers that are used to control the height of the cooling cells formed and/or fillers used for other purposes. In some embodiments, welds may be used to affix some or all of the structures. For example, line, spot, and/or combination patterns of welds, as well as fillet, filler, through and/or other welds might be utilized. Thus, a laminate including multiple laminated cooling cells may be formed at 606.

The cooling cells are optionally separated into sections, at 608. Each section includes at least one cooling cell. For example, if a large sheet including multiple cooling cells is formed at 606, then individual cells (e.g. cooling system 100) or tiles (e.g. tile 500) may be cut from the sheet at 608. Thus, 2×2 arrays of cells may be formed at 608. In some embodiments, other sized arrays of cell(s) may be separated at 608. 608 may be performed, for example, single cells, 4×4 arrays, and/or other configurations of cells may be separated from the sheet. Cells within the tile may be separated from each other for improved vibration isolation. For example, orifice and/or top plates may only be connected by tabs. In some embodiments, 608 includes laser cutting the tiles and/or cells. In some embodiments, 608 may include making additional cuts for other purposes, such as vibration isolation.

Using method 600, cooling systems, tiles and/or cooling cells such as 100, 400, 500 and/or 501 may be formed. Thus, the benefits of such cooling systems, tiles and/or cooling cells may be realized. Further, fabrication is simplified and may be readily scaled to production of large numbers of tiles and/or cooling cells.

Figure 7A:
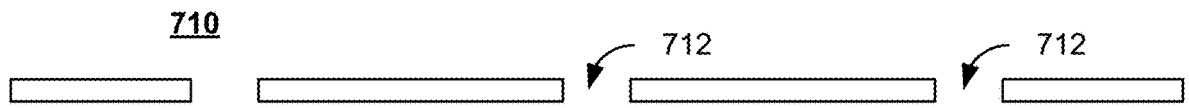
FIGS. 7A-7G depict embodiments of laminated cooling systems during fabrication.
Figure 7B:
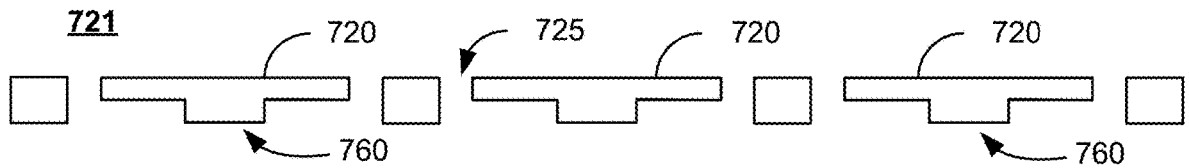
Figure 7C:
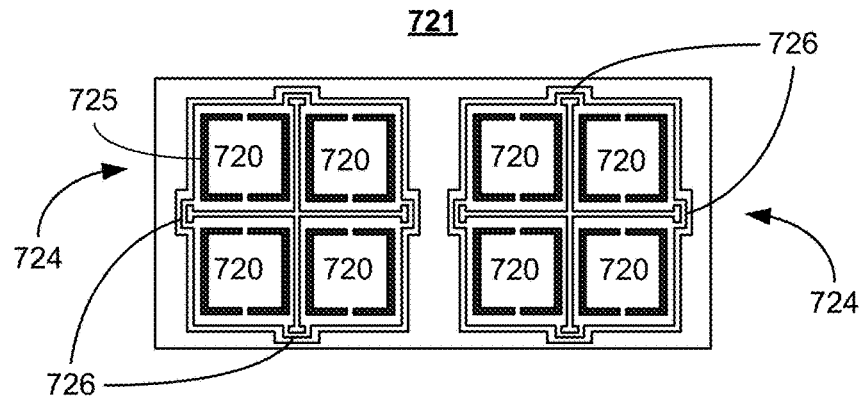
Figure 7D:
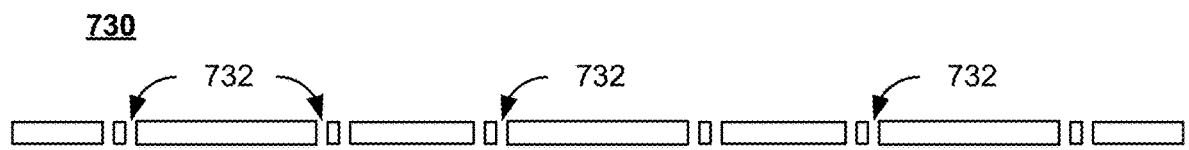

For example, FIGS. 7A-7G depict embodiments of laminated cooling systems 710 during fabrication using method 600. For simplicity, only some components are shown and not all structures discussed are labeled. In other embodiments, other components and/or other arrangements may be used. FIGS. 7A-7G are generally not to scale. Although particular numbers of cooling cells are shown, a sheet and/or laminate may include another number of cooling cells. FIGS. 7A, 7B-7C and 7D depict sheets 710, 721, and 730. In some embodiments, sheet(s) 710, 721, and/or 730 may include or be sheets that are at least fifty micrometers thick and not more than one millimeter thick prior to processing. For example, the sheets (such as sheet 721) may include or consist of one or more of steel, Al (e.g. an Al alloy), and/or a Ti (e.g. a Ti alloy such as Ti6Al-4V). Sheet 710 of FIG. 7A is a top plate sheet. Thus, vents 712 have been formed in top plate sheet 710 as part of 602. For example, vents 710 may be etched into sheet 710. FIG. 7D depicts orifice plate sheet 730 formed at 602. Thus, orifices 732 have been etched into orifice sheet 730. Two sets of orifices 732 are formed for each cooling cell to be provided. Other structure may be formed in or on sheets 710 and/or 720 in some embodiments.

FIGS. 7B and 7C depict cross-sectional and top views of active element sheet 721 formed at 602. Thus, cooling elements 720 and anchor 760 have been formed as part of 602. Apertures 725 have also been formed. Thus, cooling element 720 and anchor 760 are part of an integrated structure. Thus, active element sheet 721 may be selectively etched to form anchor 760, and cooling elements 720 as well as apertures 725 separating cooling elements 720 from the cooling cell walls. In FIGS. 7B-7C, only the portions of cooling elements 720 formed from sheet 721 are explicitly depicted. For example, the piezoelectric and/or other structures used in driving cooling elements 720 are not shown in FIGS. 7B-7C. As can be seen in FIG. 7C, a large number of cooling elements 720 may be formed from the same sheet 721. In the embodiment shown in FIG. 7C, cooling elements 720 are formed in groups 724 to more readily form tiles, such as tile 500. Thus, cooling elements 720 are formed in groups 724 of four for use in four-cell tiles, such as tile 500. Top plate sheet 710 and orifice plate sheet 730 may also have structures formed in groups analogous to groups 724. In the embodiment shown, apertures 725 have been etched through and are thus shown in black in FIG. 7C. The outline of groups 724 and division between cooling elements 720 for different cells in a group 724 may be partially etched through or otherwise defined to facilitate separation of groups 724 and individual cells later in fabrication.

FIG. 7C also depicts tabs 726. Tabs 726 mechanically connect cells within a group 724, or tile. In the embodiment shown, tabs 726 are outside of the footprint of group 724. In other embodiments, tabs may be located within the footprint of group 724. For example, tabs might be directly between cooling elements 720 within a group 724. Although only shown for active element sheet 721, tabs 726 may be part of multiple sheets including but not limited to top plate sheet 710 and orifice plate sheet 730. Further, some or all of tabs 726 may be removed later in fabrication. In some embodiments, tabs 726 remain in the final device and may provide additional mechanical stability.

Figure 7E:
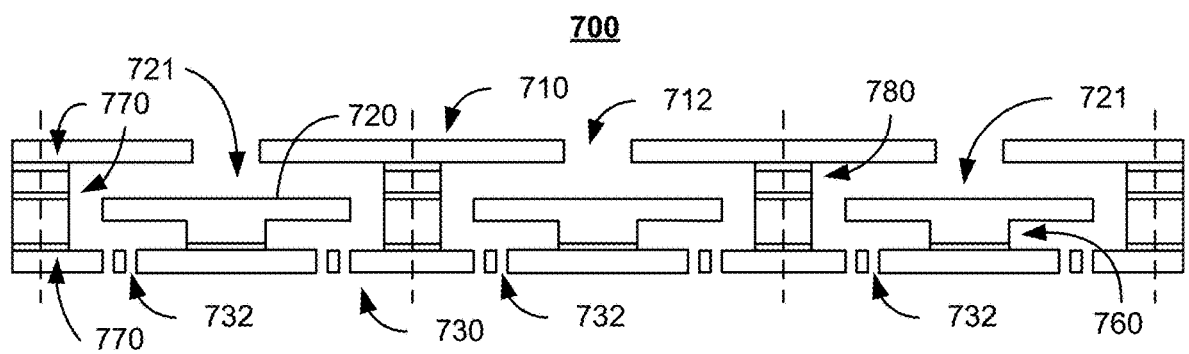

FIG. 7E depicts laminate 700 after alignment of sheets 710, 721, and 730 at 606 and attachment at 608. Also shown in FIG. 7E is a frame 780 that is used to space top plate sheet 710 from active element sheet 721. Although not shown, a piezoelectric layer, electronics and/or other components used to actuate cooling element 720 have also been provided. In some embodiments, these components are formed as part of 602, before active element sheet 721 is aligned and affixed to orifice plate sheet 730 and/or top plate sheet 710. In some embodiments, these components are formed as part of 602 after active element sheet 721 is aligned and affixed to orifice plate sheet but before top plate sheet 710 has been added. Also shown is epoxy or other adhesive(s) (including welds) 770 used to affix sheets 710, 721, 730, and 780. The coefficients of thermal expansion (CTE) of active element sheet 721, orifice plate sheet 730 and (in some embodiments) epoxy 770 used to affix sheets 721 and 730 may be closely matched. For example, the CTEs may be matched to within ten percent in some embodiments, and to within five percent in some such embodiments. Similar CTEs may improve geometric control over the cooling cells being fabricated and reduce stresses between the structures of the active element sheet 721 and orifice plate sheet 730. Dashed lines indicate the region where cooling cells may be separated. For example, a cut, such as a laser cut, may be made at or near the dashed lines. In some embodiments, at least some apertures that defined individual cells already exist. For example, pre-existing apertures define groups 724 shown in FIG. 7C. Thus, laminate 700 includes multiple sheets that have been fabricated, aligned and attached, forming cooling cells.

Figure 7F:
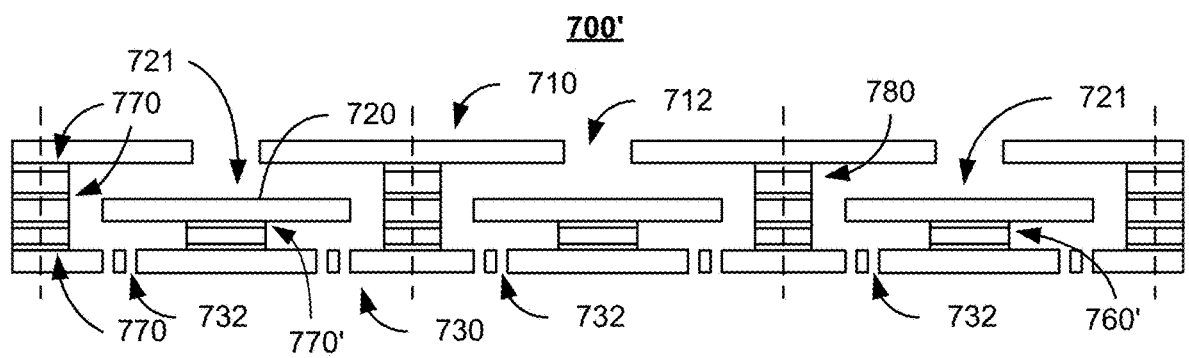

FIG. 7F depicts another embodiment of laminate 700'. Laminate 700' includes top plate sheet 710 including vents 712, frame 780, active element sheet 721 having cooling elements 720, orifice plate sheet 730 having orifices 732 therein, and epoxy or other adhesive(s) 770. Dashed lines indicate regions where individual cells may be separated, for example via a laser or other cut. Also shown is anchor sheet 760' from which anchors 760' are formed. Thus, anchor sheet 760' is affixed to orifice plate sheet 730 via epoxy or other adhesive(s) 770. Anchor sheet 760' is affixed to active element sheet 721 via epoxy 770' or other adhesive(s). Laminate 700' thus includes multiple cooling cells in which the anchor 760' is separately fabricated in a sheet and bonded to the active element sheet 721.

Figure 7G:
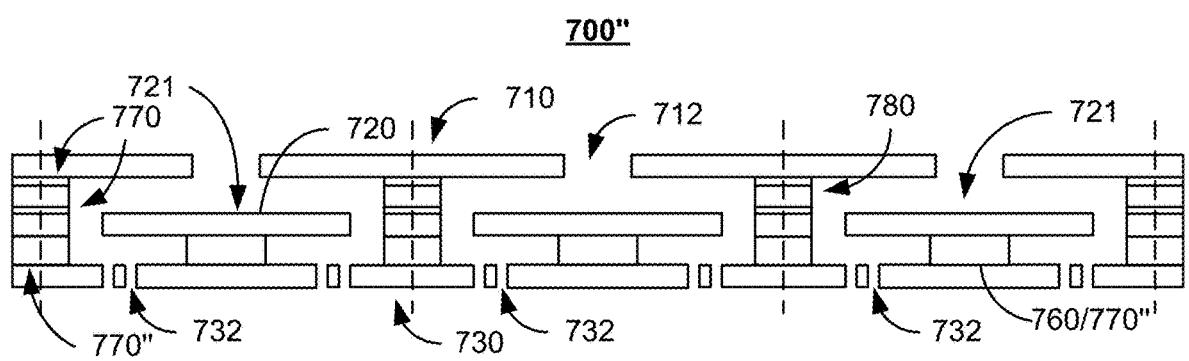

FIG. 7G depicts another embodiment of laminate 700". Laminate 700" includes top plate sheet 710 including vents 712, frame 780, active element sheet 721 having cooling elements 720, orifice plate sheet 730 having orifices 732 therein, and epoxy or other adhesive(s) 770. Dashed lines indicate regions where individual cells may be separated, for example via a laser or other cut. In lieu of an anchor sheet or integrated anchor, epoxy and/or other adhesive(s) form anchor 760'/770". Laminate 700' thus includes multiple cooling cells in which the anchor 760' is separately formed during bonding of sheets 721 and 730. In another embodiment, anchors may be formed from orifice plate sheet 730. For example, orifice plate sheet 730 may be etched not only to form apertures 732 but also to remove material around the regions at which anchors are desired to be formed. In some embodiments, an anchor structure may be fabricated on orifice plate sheet 730 in another manner.

Thus, laminated cooling cells and/or cooling tiles may be formed. Thus, the benefits of such cooling systems, tiles and/or cooling cells may be realized. Further, fabrication is simplified and may be readily scaled to production of large numbers of tiles and/or cooling cells.

Figure 8A:
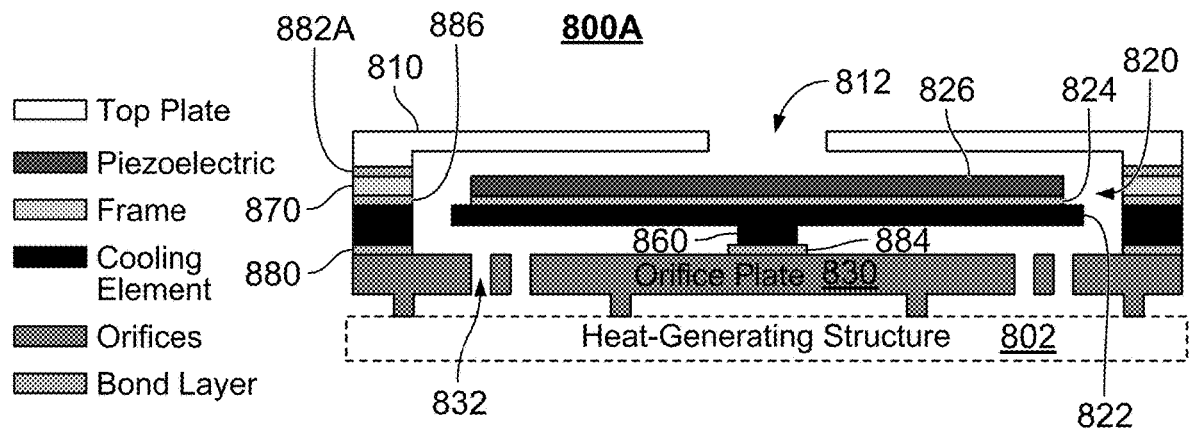
FIGS. 8A-8C are diagrams depicting embodiments of laminated cooling systems 800A, 800B, and 800C indicating fabrication using sheet level fabrication.
Figure 8B:
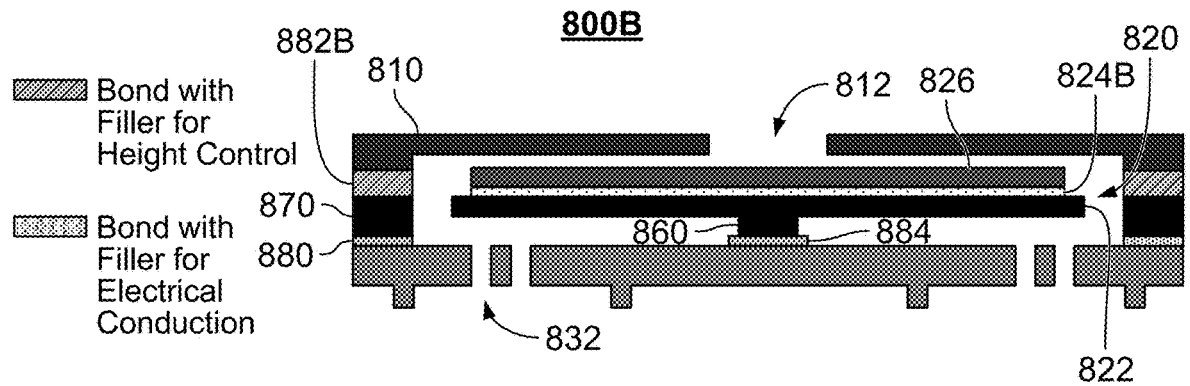
Figure 8C:
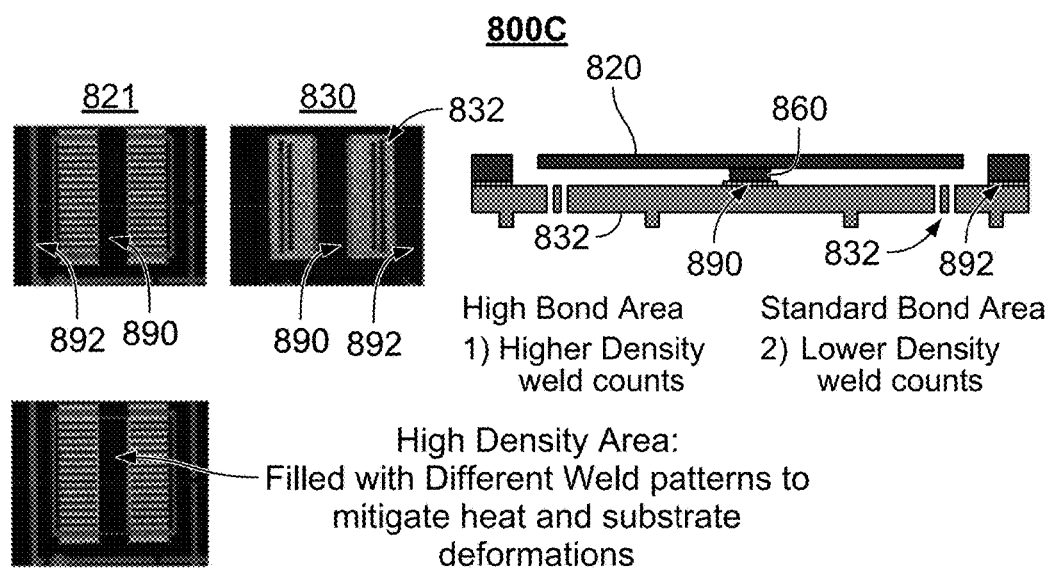

FIGS. 8A-8C are diagrams depicting embodiments of cooling systems 800A, 800B, and 800C indicating fabrication using sheet level fabrication. Thus, cooling systems 800A, 800B, and 800C are laminated cooling systems. For simplicity, only some components are shown and not all structures discussed are labeled. In other embodiments, other components and/or other arrangements may be used. FIGS. 8A-8C are not to scale. Cooling systems 800A, 800B, and 800C may also be part of a tile, such as tile 500. Cooling systems 800A, 800B, and 800C may thus be considered laminated cooling cells.

FIG. 8A depicts cooling system 800A. Cooling system 800A includes top plate 810 having apertures 812, cooling element 820, orifice plate 830 including orifices therein, a top chamber, a bottom chambers and anchors (support structures) 860 that are analogous to top plate 110 having apertures 112, cooling element 120, orifice plate 130 having orifices 132, top chamber 140, bottom chamber 150 and anchor 160. The location of the heat-generating structure 802 with which cooling system 800A is desired to be used is indicated by a dashed line.

As can be seen in FIG. 8A, multiple layers of structures have been fabricated, attached, and, in some embodiments, separated to form cooling system 800A. Thus, in addition to the structures described above, bond layers 880, 882, 884, and 886 are shown. Such bond layers are used to attach structures such as orifice plate 830, frame 870 and top plate 810. In some embodiments, frame 870 is nominally one hundred micrometers thick. However, other thicknesses may be used. Also show is bond layer 824 for cooling element 820, which may be formed at 602 and is used to affix piezoelectric 826 to substrate 822. In some embodiments, substrate 822 may be stainless steel, an Al alloy (including Al only), and/or a Ti alloy such as Ti6Al-4V. Substrate 822 may be considered to flex when piezoelectric 826 is driven. Thus, in some embodiments, substrate 822 is considered an actuator for cooling element 820. In some embodiments, all of cooling element 820 may be considered to be an actuator. Bond layers 824, 880, 882, 884 and/or 886 may be formed using epoxy adhesives. Such epoxy adhesives may have a high modulus. In some embodiments, the epoxy adhesives may be applied as films or sheets, dispensed as liquid by needle, screen printing, ink jet, sprayed. Epoxies that are cured thermally or via ultraviolet radiation may also be used. Other adhesives such as Pressure Sensitive Adhesive, Acrylic adhesives and the like might also be used.

In some embodiments, the adhesives may be filled to tailor performance. For example, filler may be used to adjust thermal conductivity, electrical conductivity, thickness (e.g. bond height), modulus, and/or other characteristics. For example, FIG. 8B depicts cooling system 800B that is analogous to cooling system 800. Cooling system 800B includes components analogous to those in cooling system 800. Such components have analogous labels. Further, filled bonds 882B and 824B that are analogous to bonds 882 and 824, respectively are shown. Filled bond 882B includes filler that is used to control the height of cooling system 800B. Filled bond 824B includes an electrically conductive filler. Consequently, piezoelectric 826 may be electrically coupled to filled bond 824. In addition, filled bond 824 may be electrically coupled to substrate 822.

In some embodiments, one or more structures may be welded. For example, systems 800C depict cooling cells in which welds have been used to affix the anchor to the orifice plate, to affix the anchor to the cooling element, and to attach the chamber walls to the orifice plate. Also indicted in FIG. 8C are regions 890 and 892 in which weld patterns are formed. In the embodiment shown, a higher density of welds 890 are used for anchor 860. A lower density of welds 892 may be used for the edges (walls) of cooling cell 800A and/or 800B. Welding may be desired because welding produces high mechanical strength bonds. As indicated in FIG. 8C, different weld patterns may be used to mitigate heat and substrate deformation.

Formation of the systems shown in FIGS. 8A-8C may be carried out using method 600. Further, multiple cooling systems may be formed together. For example, for cooling system 800, layers 822, 824 and 826 of cooling element 820 may be formed in a sheet at 602. Also at 602, anchor 860 may be formed by removing a portion of substrate 822. In such an embodiment, anchor 860 is integrated into cooling element 820. If cooling element 820 has a shape analogous to cooling element 120', then substrate 822 may be etched to form the step, extension and outer regions. Because multiple cooling elements 820 may be formed in a sheet, multiple anchors 860 are formed at 602. Also at 602 individual cooling elements 820 may be separated from the sheet for assembly. In some embodiments, cooling elements are separated later in fabrication. Also at 602, the orifices in orifice plate 830 may be formed. Orifice plate 830 may also be formed in a sheet that includes multiple sets of orifices corresponding to orifice plates 830. Aperture 812 in top plate 810 may also be provided at 602. Top plate 810 may also be formed in a sheet that includes multiple apertures 812 corresponding to top plates 810. The structures are aligned with their desired position and attached, at 604 and 606. In some embodiments, individual cooling elements 820 are aligned to regions between the orifices and attached to the sheet for orifice plates 830. In some embodiments, a sheet for cooling elements 820 is aligned and attached, for example via bond layers 880 and/or 884. In embodiments in which anchor 860 is not integrated into cooling element 820, anchors 860 are attached separately to the sheet containing orifice plates 830. The sheet may then be etched to separate cooling elements 820 from the chamber walls. Also at 606, frame 870 (provided as part of 602) may be attached via bond layers 886. The sheet containing top plates 810 is also aligned and attached via bond layers 882. Individual cooling systems 800 or sets of cooling systems (e.g. tiles) may then be separated from the sheet at 608. Analogous processes may be utilized to fabricate cooling systems 800B and/or 800C.

Figure 9:
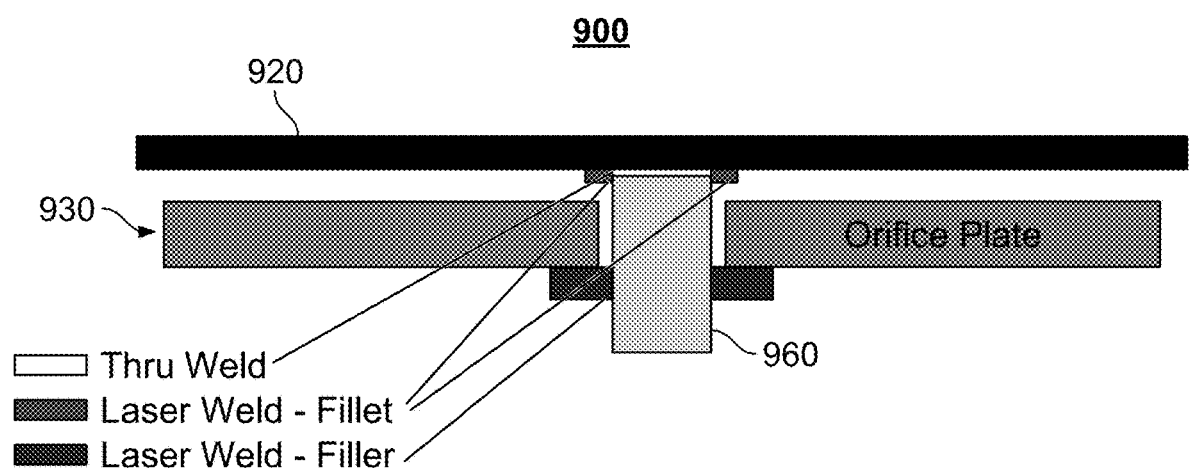
FIG. 9 is a diagram depicting an embodiment of a cooling system during fabrication and in which welds are used.

FIG. 9 is a diagram depicting an embodiment of cooling system 900 in which welds are used during fabrication. Thus, a portion of cooling system 900 is shown. For simplicity, only some components are shown and not all structures discussed are labeled. In other embodiments, other components and/or other arrangements may be used. FIG. 9 is not to scale.

Cooling system 900 includes cooling element 920, orifice plate 930, and anchor 960. Top plate and other structures which complete cooling cell 900 are not shown. Further, orifices analogous to orifices 132, 432, 532, 732, and 832 are not shown. More specifically, various welds are used for anchor 960 and actuator/cooling element 920. As indicated in FIG. 9, laser welds may be used to affix the anchor to a corresponding aperture in the orifice plate. Laser weld filler may also be provided. The actuator 920 may also be affixed to anchor 960 using weld(s). In such an embodiment, 604 and 606 of method 600 may include aligning the anchors 960 to corresponding apertures in the sheet containing the orifice plates, completing various welds, aligning the sheet containing cooling elements 920 to their desired positions and completing welds between anchors 960 and cooling elements 920. Thus, multiple configurations may be used in fabricating cooling cells via sheet level fabrication.

Figure 10:
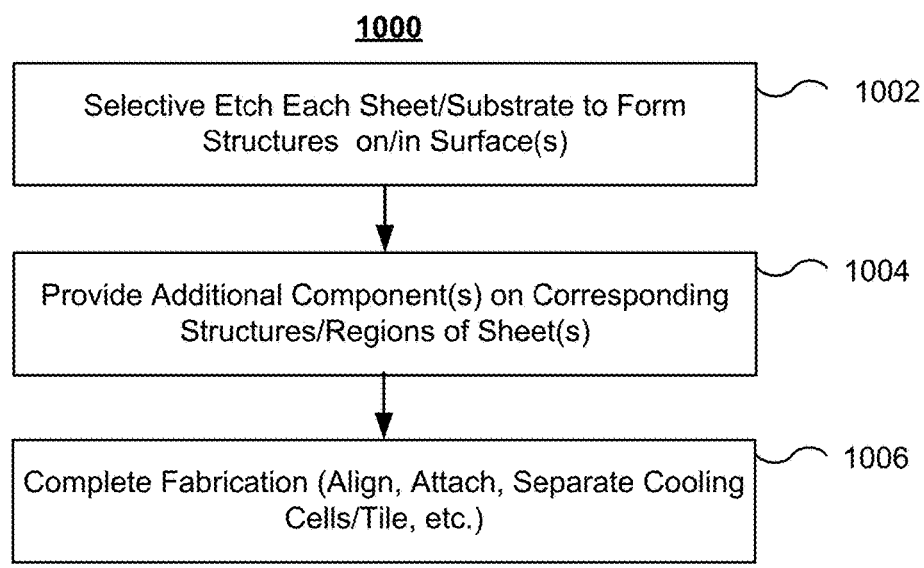
FIG. 10 is a flow chart depicting an embodiment of a method for providing cooling system(s) using sheet level fabrication.

FIG. 10 is a flow chart depicting an embodiment of method 1000 for providing cooling system(s) using sheet level fabrication. For simplicity, not all steps are shown. Further, the steps may be performed in another order, include substeps and/or be combined. Method 1000 is primarily described in the context of fabricating multiple cooling systems. However, a single cooling system may be formed.

Each sheet is selective etched to form desired structures, at 1002. For example, regions of a sheet may be masked and etched to form apertures therein. The mask may be removed and replaced and the sheet etched to vary the thickness of the sheet. Such variations in thickness may be used to provide structures, such as an anchor, or other features. Further, because sheets are physically separable, the top only, the bottom only, or both the top and bottom of a sheet may be etched. For example, apertures in a top plate sheet may be formed by etching the sheet from both sides. Similarly. Engineered cooling element having variations in both the top (top plate facing) and bottom (orifice plate facing) surfaces may be formed.

Additional components for each sheet are provided on the sheets, at 1004. For example, the piezoelectric layer, seed layers, and/or other electrical connection layers may be provided on the active element sheet. Because sheets are physically separable, structures may be provided on the top and/or the bottom of a sheet. In some embodiments, 1002 and 1004 are performed while a particular sheet if free. In some embodiments, 1002 and/or 1004 may be performed while the sheet is affixed to another sheet. Thus, 1002 and 1004, may be viewed as corresponding to 602 of method 600.

Fabrication of the laminate is completed, at 1006. For example, each sheet may be aligned and affixed to the remaining sheet(s), cells and/or tiles may be separated, and/or additional structures may be formed.

FIGS. 11A-11D depict an embodiment of a portion of a laminated cooling system during fabrication using method 1000. In particular, an active element sheet 1121 is shown. For simplicity, only some components are shown and not all structures discussed are labeled. In other embodiments, other components and/or other arrangements may be used. FIGS. 11A-11D are generally not to scale. Although particular numbers of cooling cells are shown, a sheet and/or laminate may include another number of cooling cells.

Figure 11A:
FIGS. 11A-11D depict an embodiment of laminated cooling systems during fabrication.
Figure 11B:
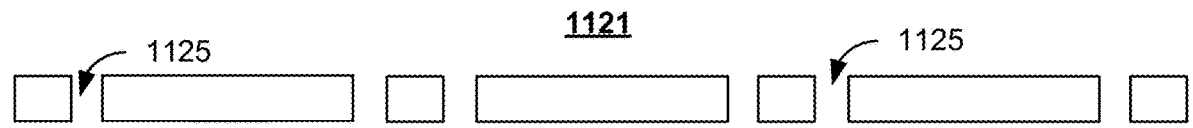
Figure 11C:
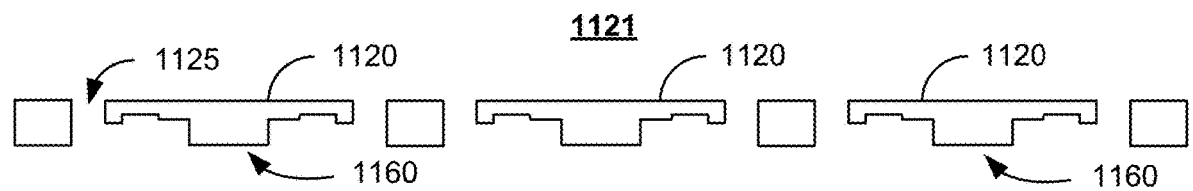
Figure 11D:
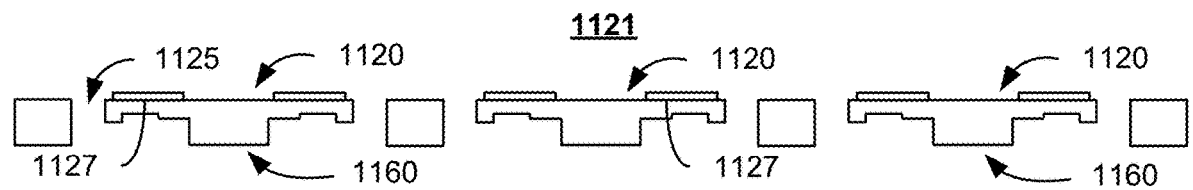
Figure 12A:
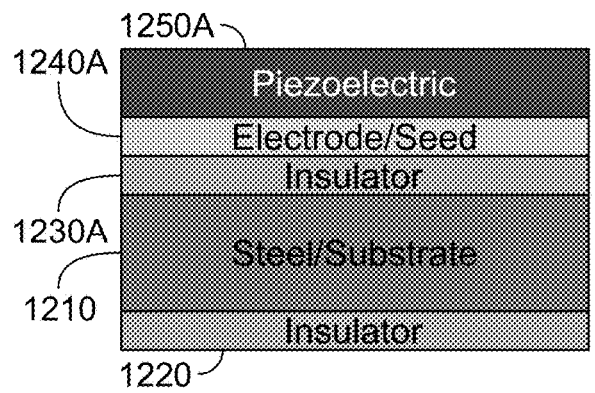
FIGS. 12A-12D depict embodiments of portions of cooling elements formed using sheet level fabrication.
Figure 12B:
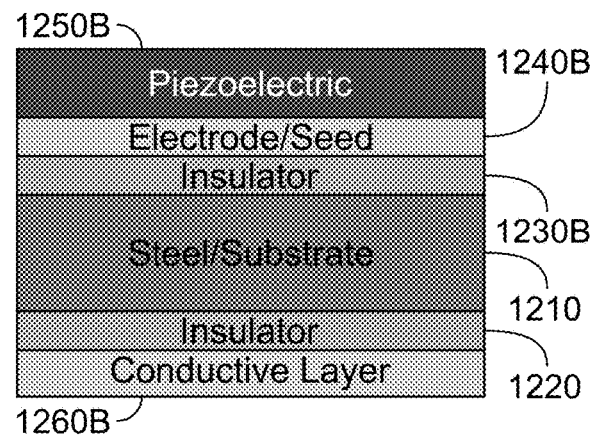
Figure 12C:
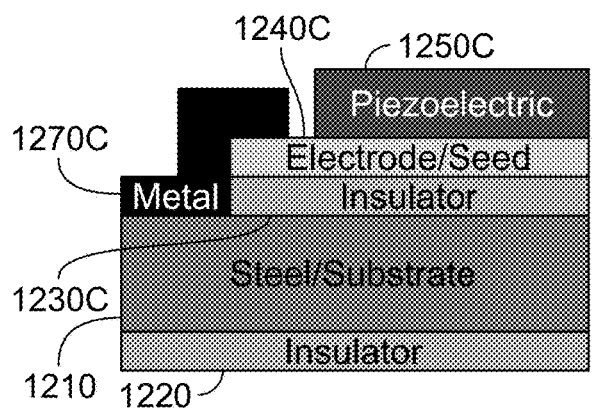
Figure 12D:
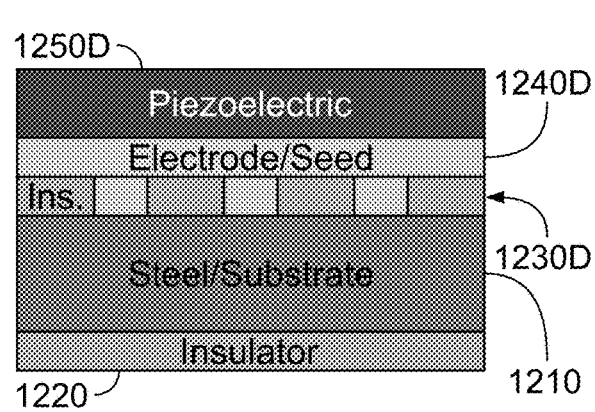

FIG. 11A depicts active element sheet 1121 before processing. In some embodiments, active element sheet 1121 is a stainless steel sheet, an Al alloy sheet, or a Ti alloy such as Ti6Al-4Vsheet. FIG. 11B depicts active element sheet 1121 after apertures 1125 have been formed as part of 1002. Apertures 1125 separate the cooling elements being formed from the walls of the cooling cells. In some embodiments, however, a portion (not shown) of the cooling element remains connected. Apertures 1125 might be fabricated by etching the top side and/or the back side of active element sheet 1121. FIG. 11C depicts active element sheet 1121 after further etching as part of 1002. Thus, anchors 1160 have been formed. In addition, an engineered cooling element 1120 having a varying thickness has fabricated. Thus, a back side etch of active element sheet 1121 may be etched to form portions of structures 1120 and/or 1160. FIG. 11D depicts active element sheet 1121 after piezoelectric layers 1127 have been provided as part of 1004. Other structures may also be provided as part of 1004. Laminated cooling cells (not shown) including active element sheet 1121 are formed at 1006.

Thus, a sheet may be fabricated and integrated into laminated cooling cells and/or laminated cooling tiles. Thus, the benefits of such cooling systems, tiles and/or cooling cells may be realized. Further, fabrication is simplified and may be readily scaled to production of large numbers of tiles and/or cooling cells.

FIGS. 12A-12D depict embodiments of portions of cooling elements 1200A, 1200B, 1200C, and 1200D indicating fabrication that allows for the substrate to be electrically connected to the electrode. As can be seen in FIGS. 12A, 12B, 12C, and 12D, cooling elements 1200A, 1200B, 1200C, and 1200D, respectively, each includes at least a first insulator 1220, a stainless steel, Al alloy, and/or Ti alloy substrate (e.g. the sheet) 1210, and second insulator 1230A, 1230B, 120C, and 1230D, respectively. Cooling elements 1200A, 1200B, 1200C, and 1200D also include an electrode (e.g. a bottom electrode) 1240A, 1240B, 1240C, and 1240D, respectively, that may also serve as a seed layer for piezoelectric layer 1250A, 1250B, 1250C, and 150D, respectively. Cooling element 1200B includes an additional conductive layer 1260B. In order to make electrical contact between substrate 1120 and electrode 1240C, cooling element 1200C includes metal layer 1270C, or jumper. To ensure contact between substrate 1120 and electrode 1240C, a portion of insulator 1230C has been removed. In cooling element 1200D, this electrical contact is made by forming vias in insulator 1230D prior to deposition of electrode layer 1240D. Thus, the substrate 1220 can be electrically connected with the bottom electrode 1240A, 1240B, 1240C or 1240D.

Laminates including multiple cooling elements formed from sheets may be fabricated. Individual laminated cooling cells and/or laminated tiles may be separated off from the laminate. Thus, the benefits of such cooling systems, tiles and/or cooling cells may be realized while simplifying fabrication. Such fabrication may also be readily scaled to production of large numbers of tiles and/or cooling cells. Thus performance and manufacturing of cooling cells may be improved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for providing a cooling system, the method comprising:
   providing a plurality of sheets, each of the plurality of sheets including at least one structure for a corresponding level of a plurality of levels in each cooling cell of a plurality of cooling cells, wherein the plurality of levels includes a first level, a second level, and a third level, and wherein the providing of the plurality of sheets further includes:
      providing a top plate sheet, the top plate sheet including at least one vent therein for each cooling cell of the plurality of cooling cells, wherein the top plate sheet corresponds with the first level;
      providing an orifice plate sheet having a plurality of orifices therein, wherein the orifice plate sheet corresponds with the second level;
      providing an active element sheet including a cooling element for each cooling cell of the plurality of cooling cells, the cooling element having a central region and a perimeter, at least a portion of the perimeter being free to undergo vibrational motion, wherein the cooling element having a first side and a second side, the cooling element being configured to undergo the vibrational motion to drive fluid from the first side to the second side to flow across a surface of a heat-generating structure to cool the heat-generating structure, wherein the active element sheet corresponds with the third level, wherein the providing of the active element sheet comprises:
         selectively etching a substrate to provide a plurality of regions having a plurality of heights, the substrate including at least one of stainless steel, an Al alloy, and a Ti alloy;
         providing a piezoelectric layer on a portion of the substrate;
         providing an insulating barrier on the substrate;
         providing a bottom electrode on the insulating barrier, the piezoelectric layer residing on the bottom electrode; and
         connecting the bottom electrode to the substrate, the connecting the bottom electrode include a process selected from providing a jumper between the bottom electrode and the substrate and providing at least one via in the insulating barrier prior to the providing the bottom electrode, wherein the jumper corresponds to a metal layer;
   aligning the plurality of sheets;
   attaching the plurality of sheets to form a laminate, the laminate including the plurality of cooling cells; and
   separating the laminate into a plurality of sections, each of the plurality of sections including at least one cooling cell of the plurality of cooling cells.

2. The method of claim 1, wherein the providing the plurality of sheets further include:
   providing a frame sheet, a portion of the frame sheet forming cell walls for each cooling cell of the plurality of cooling cells, wherein the plurality of levels further includes a fourth level, and wherein the frame sheet corresponds with the fourth level.

3. The method of claim 2, wherein attaching further includes:
   affixing the plurality of sheets such that the active element sheet is affixed to the orifice plate sheet, the frame sheet is affixed to the active element sheet or top plate sheet, and the top plate sheet is affixed to the frame sheet or to the frame sheet as affixed to the active element sheet.

4. The method of claim 1, wherein the aligning further includes:
   locating the active element sheet between the top plate sheet and the orifice plate sheet.

5. The method of claim 1, wherein providing the active element sheet further includes:
   defining a support structure for the cooling element from a portion of the active element sheet.

* * * * *